United States Patent [19]

Pflasterer

[11] 4,179,662

[45] Dec. 18, 1979

[54] MULTIBAND SCANNING RADIO RECEIVER USING FREQUENCY SYNTHESIZER

[75] Inventor: Peter W. Pflasterer, Oak Ridge, Tenn.

[73] Assignee: Masco Corporation of Indiana, Taylor, Mich.

[21] Appl. No.: 931,131

[22] Filed: Aug. 4, 1978

Related U.S. Application Data

[63] Continuation-in-part of Ser. No. 450,983, Mar. 14, 1974, Pat. No. 3,961,261, and a continuation of Ser. No. 779,794, Mar. 21, 1977, abandoned, which is a continuation of Ser. No. 586,178, Jun. 12, 1975, abandoned.

[51] Int. Cl.$^2$ ............................................. H04B 1/26
[52] U.S. Cl. ..................................... 325/470; 325/453; 325/459; 325/460; 331/1 A
[58] Field of Search ................ 325/470, 335, 453, 455, 325/458, 459, 460, 468, 469, 421, 464, 419; 334/18; 331/1 A, 1 R, 2, 4

[56] References Cited

U.S. PATENT DOCUMENTS

| | | | |
|---|---|---|---|
| 3,119,067 | 1/1964 | Wohlenberg | 325/477 |
| 3,824,475 | 7/1974 | Pflasterer | 325/470 |
| 3,873,924 | 3/1975 | Fathauer | 325/470 |
| 3,931,578 | 1/1976 | Gittinger | 325/461 |
| 3,961,261 | 6/1976 | Pflasterer | 325/335 |
| 3,987,400 | 10/1976 | Fathauer | 325/470 |
| 4,027,251 | 3/1977 | Fathauer | 325/421 |

Primary Examiner—Benedict V. Safourek
Assistant Examiner—Tommy P. Chin
Attorney, Agent, or Firm—Leon E. Redman

[57] ABSTRACT

A scanning FM monitor receiver is disclosed which is of the superheterodyne type and is capable of scanning and receiving a plurality of channels on a plurality of bands. The receiver incorporates a phase-locked-loop frequency synthesizer which eliminates the need for crystals for every channel. The input data that the synthesizer requires to develop the individual preselected frequencies is provided by a random access memory that is programmed by the user for the frequencies desired. Indicator lamps on the receiver illuminate when a channel is being scanned and also provides a visual accuracy check when an operator programs the random access memory with the data codes for producing the various frequencies.

3 Claims, 7 Drawing Figures

MULTIBAND SCANNING RADIO RECEIVER USING FREQUENCY SYNTHESIZER

This is a continuation-in-part of my copending application Ser. No. 450,983, filed Mar. 14, 1974, now issued as U.S. Pat. No. 3,961,261 and a continuation of copending application Ser. No. 779,794 now abandoned filed on Mar. 21, 1977, which is a continuation of application Ser. No. 586,178 filed on June 12, 1975, now abandoned.

This invention generally relates to signal-seeking receivers and, more particularly, to signal-seeking radio receivers which automatically sequentially scan a predetermined plurality of channel frequencies and stop at a receiving channel.

Radio receivers which are capable of scanning a number of predetermined channels in one or more separate limited frequency bands are now well-known. Such receivers enable one to monitor several predetermined channels because the receiver is capable of sequentially scanning a plurality of individual channels and automatically stoping when it is receiving on one of the channels. Many of the receivers have recently been designed to monitor only certain selected discrete channels that are of the most interest. This capability has been achieved by providing a crystal oscillator with means for selectively introducing one of a plurality of crystals into the tuning circuit of the oscillator for the various channels. The crystal frequencies are preselected for the channels being monitored, since a superheterodyne receiver operates by having the oscillator output beat against the received signal to tune in the respective channels or stations. Such receivers included circuitry that automatically sequentially switched the respective crystals into the tuning circuit of the oscillator, and if the channels were in more than one band, properly activated the band switch. Such receivers required installing as many crystals in the oscillator as there were channels to be monitored. Thus, if a dozen channels were to be monitored, it was generally necessary to provide a dozen different crystals in the receiver. In this connection, it was often necessary for a user to experience the inconvenience and expense of separately purchasing and installing the particular crystals required to monitor the desired frequency channels. Moreover, if a different frequency channel was subsequently desired to be monitored, it was necessary to purchase and interchange or add the new crystal to the receiver.

Accordingly, it is an object of the present invention to provide an improved scanning radio receiver which eliminates the undesirable attributes associated with such crystals through the use of a frequency synthesizer and associated circuitry which enables the sequential scanning of plurality of separate frequency channels within a number of bands.

It is another object of the present invention to provide such an improved scanning radio receiver which includes a programmable memory circuit which provides coded input signals to the synthesizer for generating the frequencies required for monitoring the desired channels.

Yet another object of the present invention is to provide a scanning radio receiver as described above which also includes means for checking the coded signals as they are programmed into the memory that drives the synthesizer.

Other objects and advantages will become apparent upon reading the following detailed description, while referring to the attached drawings, in which.

Broadly stated, the scanning receiver of the present invention is adapted to monitor preselected channels within three separate bands; namely, a low band having a frequency range of 30 to 50 megaHertz (MHz), a high band frequency range of 150 to 170 MHz and a UHF band having a frequency range of 450 to 470 MHz. Since the width of each of the bands is 20 MHz, it is convenient to convert the high frequency band to the low band frequency which can then be mixed with the output of a frequency synthesizer to selectively receive any of the channels. The frequency synthesizer generates frequencies in five kiloHertz (kHz) steps that span the entire 20 MHz band width so that virtually any of the transmitting channels can be monitored. The frequency synthesizer is controlled by a programmable memory and memory logic circuitry which provides the necessary coded input data to the frequency synthesizer as well as to band switching logic circuitry. The programmable memory and memory logic circuitry are in turn controlled by channel select logic circuitry which sequentially scans through the predetermined channels. The receiver also provides a visual indication when the individual channels are being scanned. When one of the channels is received, a detector notes such condition and controls circuitry which prevents the channel select logic from advancing until the channel is no longer being received.

Figure 1:
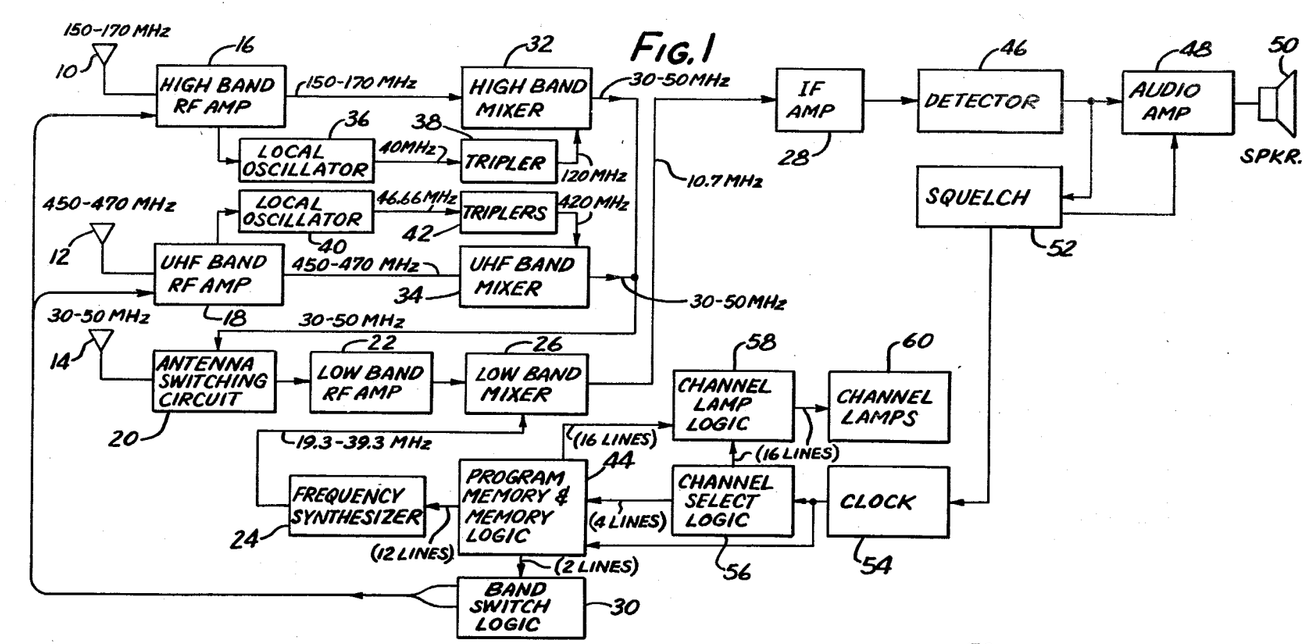
FIG. 1 is a block diagram of the electrical circuitry embodying the present invention.

Turning now to the drawings, and particularly FIG. 1, there is shown an electrical block diagram of the scanning receiver embodying the present invention. The receiver has three antennas, 10, 12 and 14, which receive signals of 150-170 MHz, 450-470 MHz and 30-50 MHz, respectively. The antenna 10 feeds the 150-170 MHz signal into a high band RF amplifier 16, while the antenna 12 is connected to a UHF band RF amplifier 18 and antenna 14 is connected to an antenna switching circuit 20 which is connected to a low band RF amplifier 22. Since the 20 MHz bandwidth is identical for all three bands, it is convenient to convert the higher frequency signals down to the frequency of the low band i.e., 30-50 MHz so that the output of a frequency synthesizer 24 can be fed to a low band mixer 26 and produce an output signal of 10.7 MHz which provides the input to an IF amplifier 28. Since the output frequencies of the frequency synthesizer 24 vary in 5 kHz steps within the range of 19.3 to 39.3 MHz, the conversion of the high UHF band frequencies down to the 30-50 MHz range enables the frequency synthesizer to operate regardless of the band from which the particular signal originates.

To identify the proper frequency, it is necessary to identify the band, as well as the output frequency of the frequency synthesizer 24 and, accordingly, a band switching logic circuit 30 is provided and is connected to the amplifiers 16 and 18 for the high and UHF bands and to the antenna switching circuit 20 for connecting the low band antenna 14 to the low band amplifier 22 which is not switched on and off. Unlike the low band amplifier 22, however, the high and UHF band amplifiers 16 and 18 are only on when channels having frequencies within those bands are being monitored. Thus, for a particular channel that is to be monitored, the band switching logic circuit 30 would energize one of the amplifiers 16 or 18 if the channel was in either of these bands, and would also operate the antenna switching circuit 20 to connect either the low band antenna 14 or one of the outputs from the high or UHF band circuits.

In this connection, the high band amplifier 16 is connected to a high band mixer 32, the output of which is connected to the antenna switching circuit 20. Similarly, the UHF band amplifier 18 is connected to a UHF band mixer 34, and its output is also connected to the antenna switching circuit 20. The mixers 32 and 34 are operable to reduce or convert the higher frequencies signals to the 30–50 MHz range by superheterodyning the received signal against another signal that is generated by a local oscillator. To this end, and referring to the circuitry associated with the high frequency band, a local oscillator 36 having a 40 MHz crystal is driven by the amplifier 16 so that when the amplifier is powered, the local oscillator 36 will operate. Its output is tripled by a frequency tripler 38, producing a 120 MHz signal that is fed to the mixer 32 which produces an output that is a difference signal with a frequency of 30–50 MHz.

Similarly, the UHF band includes a local oscillator 40 which includes a crystal for generating a 46.666 MHz signal which is fed to a tripler circuit 42 which twice triples the 46.666 MHz signal to provide a 420 MHz output signal that is fed to the UHF band mixer 34 yielding a difference signal of 30–50 MHz. The local oscillator 40 is powered when the UHF band amplifier 18 is powered and neither the high or UHF band amplifiers are powered when the band switch logic circuit 30 switches the antenna switching circuit 20 so that the antenna 14 is connected to the low band amplifier 22. Conversely, when either the high or UHF band amplifiers 16 or 18 are energized by the band swtiching logic circuit 30, the antenna switching circuit 20 connects the output from one of the mixers 32 or 34 to the low band amplifier 22. In this manner, the channels within only one band may be received at any one time. Moreover the band switching logic circuit 30 is controlled by the program memory and memory logic circuitry 44 which also provides the input data for the frequency synthesizer 24 so that any particular preselected channel is identified in terms of both the frequency and the band.

Figure 5:
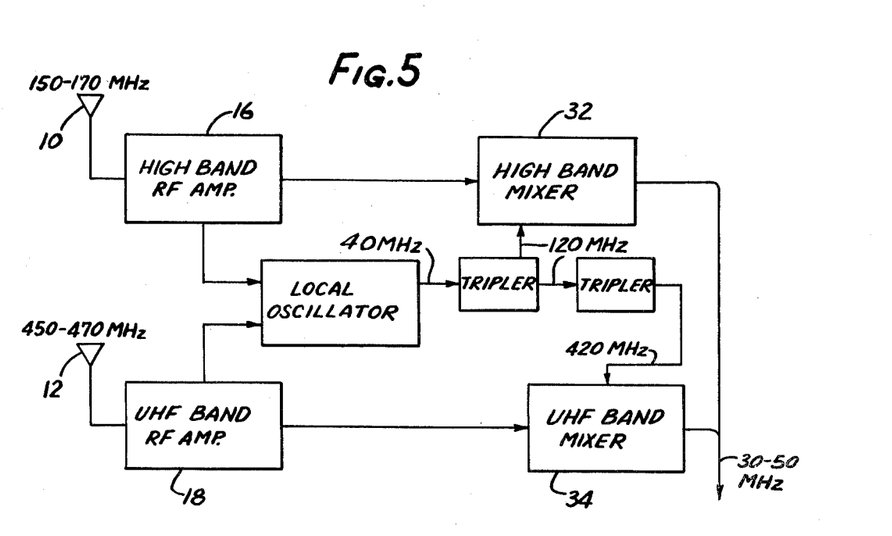
FIG. 5 is a block diagram of a modification of a portion of the circuitry shown in FIG. 1.

While the block diagram of FIG. 1 illustrates a local oscillator associated with each of the high band and UHF band amplifier and mixer circuits, a modification of this circuit is shown in FIG. 5, and has only one oscillator that is energized when either of the amplifiers are energized. Once energized, the local oscillator generates a 40 MHz signal to a first tripler the output of which is fed to the high band mixer as well as to a second tripler which produces a 420 MHz signal for the UHF band mixer. While the oscillator is energized when either of the amplifiers is energized, the signal fed to the input of the mixer of the other band produces no undesirable results since its associated amplifier is not energized.

The output of the IF amplifier 28 is applied to a detector 46 which may be a conventional circuit operating in the usual way to produce an information signal. The information signal is generally an audio signal and is preferably applied to an audio amplifier 48 to drive a speaker 50. The output of the detector is also applied to a squelch circuit 52 which operates in a conventional manner to produce a positive control signal when the information signal is being received from the detector 46 and preferably produces a logical "0" control signal when the information signal from the detector 46 becomes quite small, indicating that the channel is not being received. The squelch control signal is applied to the audio amplifier 48 to turn it off when no signal is being received. This may be achieved with well-known circuitry to prevent the audio amplifier 48 from responding to noise. The squelch control signal is also applied to a clock 54 to inhibit the clock when a signal is being received, thus stopping the sequential switching performed by a channel select logic circuit 56 once the sequential scanning reaches a channel on which a signal is being received. The channel select logic circuit 56 primarily comprises a binary counter which sequentially updates the memory and memory logic circuitry 44 and also drives channel lamp logic 58 which controls the illumination of a plurality of channel indicators 60, each of which are individually illuminated when its associated channel is being scanned or received.

As will be more fully described hereinafter, there are a total of 16 channel indicators or lights 60, each of which may correspond to a separate channel that can be monitored, provided that the program memory 44 is completely or fully programmed. To receive a particular channel, the frequency synthesizer 24 is provided with binary data information on 12 separate inputs and the band switch logic must be provided with binary data information on two inputs. Thus, for any particular channel that is to be received, the program memory 44 preferably generates 14 bits of information. The receiver is programmed for the individual channels, which requires that a coded input signal be programmed into the memory 44. The channel lights 60 are conveniently used to check the code being programmed into the receiver to insure that it is accurate as to each of the 14 data bits as it is inserted. Since any particular frequency programmed into the memory uses a binary coded signal consisting of 14 data bits in addition to other information bits to address the memory and the like, the length of the input coding signal introduces a significant chance of programming error. The utilization of the channel lamps 60 to provide a check for programming accuracy during and at the completion of the programming operation is advantageous and desirable.

Figure 2:
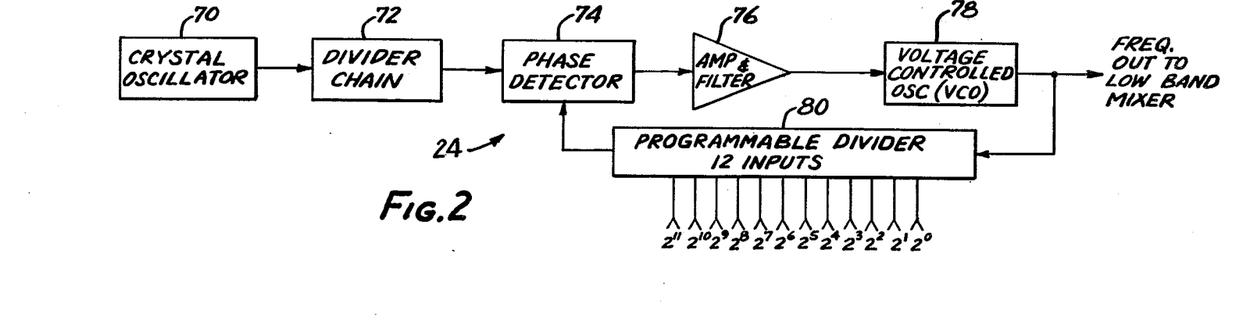
FIG. 2 is a block diagram illustrating the electrical circuitry associated with the frequency synthesizer illustrated in FIG. 1.

Referring generally to the frequency synthesizer 24, which is shown in more detail in the block diagram of FIG. 2, it is of generally conventional design and utilizes a programmable divider within a phase-locked-loop. More specifically, it comprises a crystal oscillator 70 which generates a standard reference frequency which is fed to a divider chain 72, the output of which is connected to a phase detector 74. The output of the phase detector 74 is fed to an amplifier and filter 76 and rather than showing the detailed circuitry that is contained therein. However, the standard industry designation numbers, together with the pin numbers of the integrated circuits are shown in parentheses adjacent or inside the blocks, and the detailed circuits for these block diagrammatic representations are hereby incorporated by reference herein.

Figure 4:
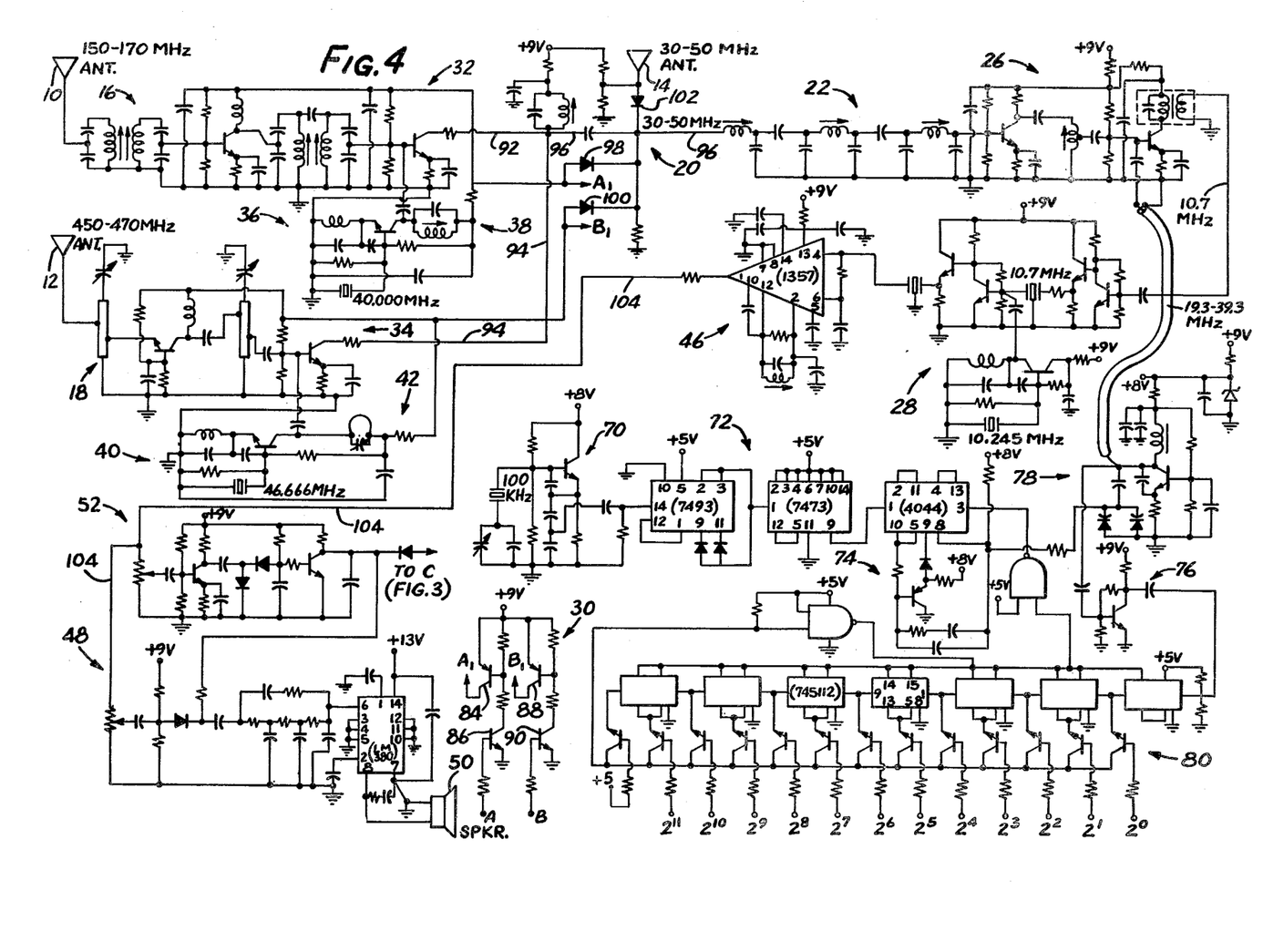
FIG. 4 is a detailed electrical schematic diagram illustrating the remainder of the detailed circuitry not shown in FIG. 3.

Referring to the high band antenna 10, amplifier 16 and mixer 32, as well as the local oscillator 36 and frequency tripler 38 which are shown in detail in the upper left portion of FIG. 4, it should be understood that these circuits all become operative when a positive voltage is applied on line $A_1$. Thus, selective application of voltage on line $A_1$ powers the circuits associated with the high band so that any channel having frequencies within this band can be received when voltage is applied. Moreover, application of voltage to the high band circuitry on line $A_1$ is controlled by the band switch logic circuit 30 shown in FIGS. 1 and 4 wherein the 9 volt supply is switched by a transistor 84 controlled by a transistor 86, that is controlled by the application of a positive voltage on line A extending to the program memory and memory logic circuit 44.

The UHF band amplifier 18, mixer 34, local oscillator 40 and frequency triplers 42 are also controlled in a manner substantially similar to the high band circuitry described above. Application of voltage on line $B_1$ controls the operation of the UHF circuitry, with the voltage on line $B_1$ originating from a switching transistor 88 located in the band switching logic circuit 30, the transistor 88 being controlled by a second transistor 90 which is also controlled by the selective application of voltage on line B which also extends to the program memory logic circuit 44. As previously mentioned, the monitoring of a specific channel requires a specific output frequency from the frequency synthesizer 24 as well as the energization of the circuitry associated with the band in which the channel frequency is located. The program memory logic circuitry 44 supplies this information to both the frequency synthesizer and the band switch logic circuit 30 which applies voltage on the lines $A_1$ of $B_1$, i.e., to energize either the high band or UHF band circuitry.

The output from the high band mixer 32 appears on line 92 and the output of the UHF band mixer 34 appears on line 94, both of which are connected to the low band amplifier 22 via the antenna switching circuit 20 and line 96. In this regard, diodes 98 and 100 are provided in the high band and UHF band voltage supply circuits so that if voltage is applied on either of the lines $A_1$ of $B_1$, the corresponding diode with be forward biased into conduction and back bias a diode 102 that is located between the low band antenna 14 and line 96. Thus, in the event either the high or UHF band circuitry is energized, the low band antenna 14 will not become operative.

Since the outputs of both the high and UHF band mixers are fed to the low band amplifier 22, it remains on, regardless of the band in which a particular channel is located. The output of the low band amplifier 22 is then fed to the low band mixer 26 where the output of the frequency synthesizer 24 is mixed with the output of the amplifier 22, resulting in a 10.7 MHz output signal that is fed to the IF amplifier 28 which is connected to the detector 46. The output of the detector 46 appears on line 104 which is connected to the squelch circuit 52 as well as the audio amplifier 48 which drives the speaker 50.

Figure 3:
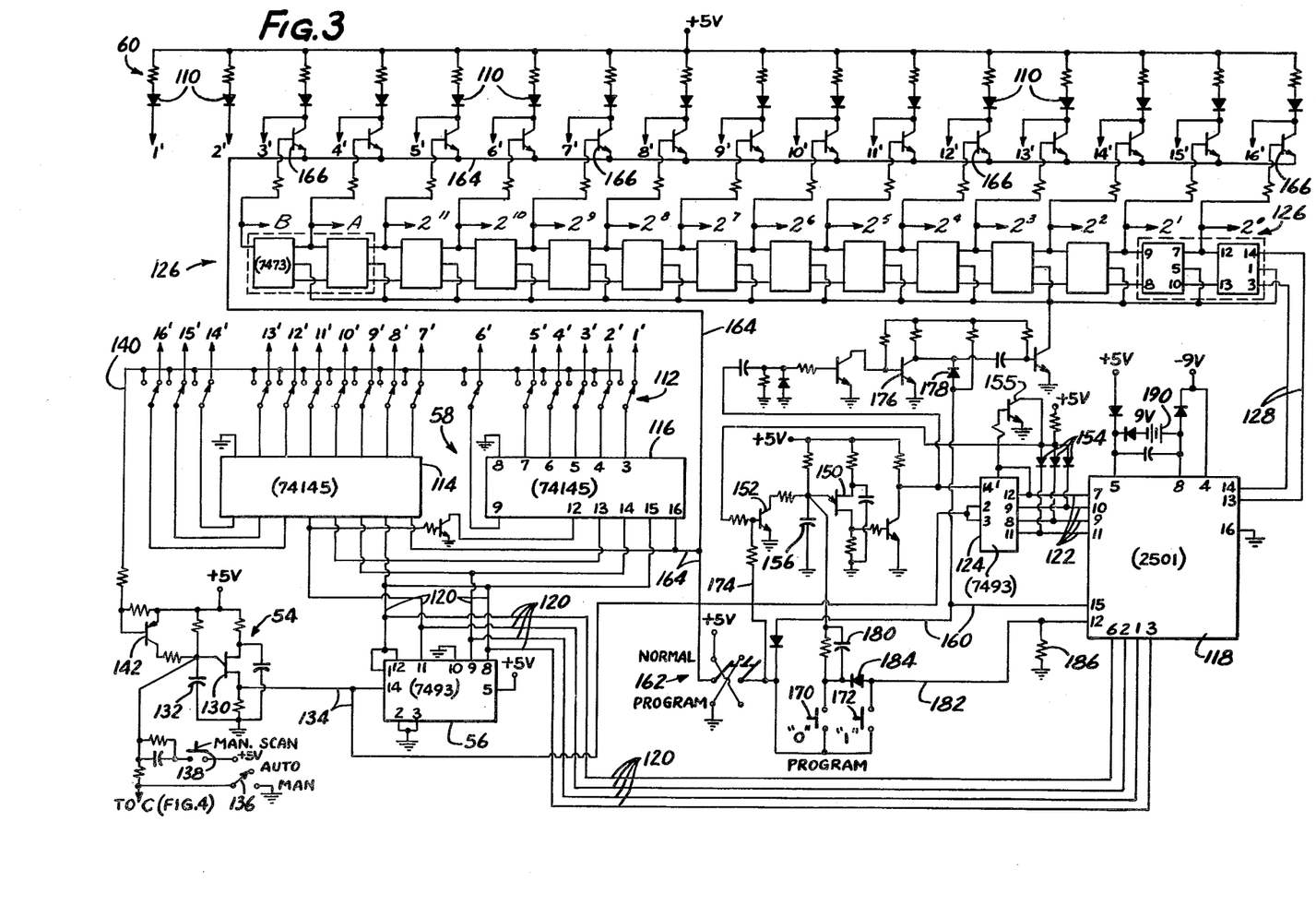
FIG. 3 is a detailed electrical schematic diagram of a portion of the circuit illustrated in FIG. 1.

The squelch circuit 52 provides a low voltage signal (approaching ground potential) on line C when the detector 46 indicates a channel is being received, and line C is connected to the clock 54 (see the lower left portion of FIG. 3). As will be more fully described hereinafter, the low voltage signal on line C effectively disables the clock 54 so that any received channel will be continued and will not be cut off until it is no longer being received.

Reference is now made to FIG. 3 which illustrates the circuitry associated with the memory and memory logic as well as the channel lamp and channel select logic portions of the receiver. At the upper part of the drawing, the channel lamps include a total of 16 light emitting diodes 110, (LEDs), each of which is associated with lines marked 1' through 16' which extend to the identically marked lines connected to respective lockout switches 112. The lockout switches are connected to the channel lamp logic circuitry 58, which is shown to be a pair of integrated circuits 114 and 116 both of which are connected to the channel select logic circuit 56 which comprises a four bit binary counter which in turn is driven by the clock 54 shown to the left thereof. The outputs from pins 8, 9, 11 and 12 of the binary counter 56 also extend to a random access memory (RAM) integrated circuit 118 through four separate lines 120. More specifically, the random access memory is a full decoded, $256 \times 1$ static random access memory, such as model 2501, manufactured by the Signetics Corporation. The memory is a 16 by 16 matrix, the "X" coordinates of which are addressed through the four input lines 120. Similarly, the "Y" coordinates are addressed by four lines 122 which are controlled by a binary counter 124 which is substantially similar to a binary counter which comprises the channel select logic circuit 56. The random access memory 118 has its output appearing on pin 13 (with the complimentary information appearing on pin 14) which is connected to a serial-in, parallel-out shift register, indicated generally at 126, by lines 128.

Thus, for any channel that is to be scanned or monitored, the programmed binary code for that channel is fed into the shift register 126 by a series of pulses appearing on lines 128. Once the 14 bits of information are fed into the shift register, they are presented to the programmable divider 80 of the frequency synthesizer 24 as well as to the band switch logic 30 enabling the band and frequency to be generated to receive that channel. The shift register comprises a number of flip-flop circuits which are connected as shown, so that a 14 bit code that is generated by the RAM 118 will be transferred to the shift register 126 and will be inserted into the programmable divider in the form of logical "1" of "0" signals. More specifically, the lines marked $2^0$ through $2^{11}$ as well as the lines marked A and B extend to the identically marked inputs of the programmable divider (see FIG. 4), except for the lines A and B which extend to the corresponding inputs of the band switch logic circuit 20 shown in FIG. 4.

It should be understood that the shift register is used in the circuitry associated with the illustrated random access memory 118 to provide a parallel input to the programmable divider 80 of the frequency synthesizer. A different type of memory having 14 separate output pins which would provide a parallel input to the divider 80 may be used and would eliminate the need for a shift register which is used in this case to shift the serial then to a voltage controlled oscillator 78 which provides the output to the low band mixer 26 shown in FIG. 1. The output of the voltage control oscillator 78 is also fed to a programmable divider 80 which has 12 binary inputs that are controlled by the program and memory logic circuitry 44 as previously discussed. The output of the divider 80 is also fed to the phase detector 74.

With respect to the operation of the synthesizer, the phase detector 74 compares the phase of the divider output with the phase of the reference frequency (a frequency resulting from dividing the frequency generated by the crystal oscillator 70) and the output of the phase detector 74 is a voltage proportional to the phase difference between the divider output and the reference frequency, which voltage is fed to the voltage controlled oscillator. If the reference frequency is less than the desired output frequency of the oscillator 78, the output frequency of the oscillator is divided by the divider 80 such that the output of the divider is equal to the reference frequency. The output of the divider 80 is compared with the reference frequency within the phase detector 74 and any phase difference is fed back to the oscillator 78 in the form of a voltage to correct the frequency of the oscillator 78. It should be understood that the output frequency of the synthesizer 24 that is fed to the low band mixer 26 may be varied by changing the input signals that are fed to the divider 80, which signals determine the frequency that is produced. As previously mentioned, the output frequency of the frequency synthesizer varies in 5 kHz steps within a bandwidth of 20 MHz and is preferably within the range of 19.3 to 39.3 MHz.

Figure 6:
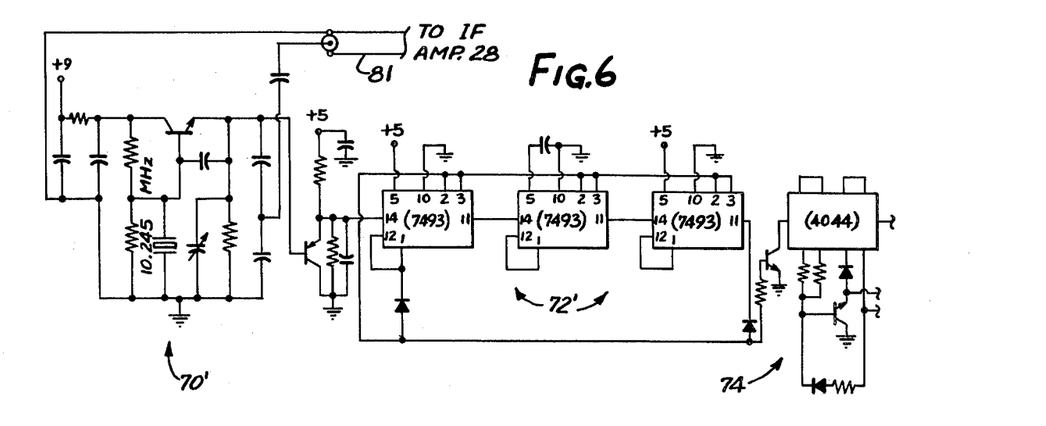
FIG. 6 is a detailed electrical schematic diagram of a modification of the circuitry associated with the frequency synthesizer illustrated in FIG. 1.

A modification of a portion of the frequency synthesizer is shown in FIG. 6 and includes an oscillator 70' having a separate frequency output that is fed to a divider chain 72' as well as to the IF amplifier 28 through a line 81. This modification enables the oscillator portion of the IF amplifier to be deleted as the output frequency of the oscillator 70' supplies this frequency. This permits a single oscillator to supply signals that are supplied by two oscillators in the FIG. 4 configuration.

Figure 7:
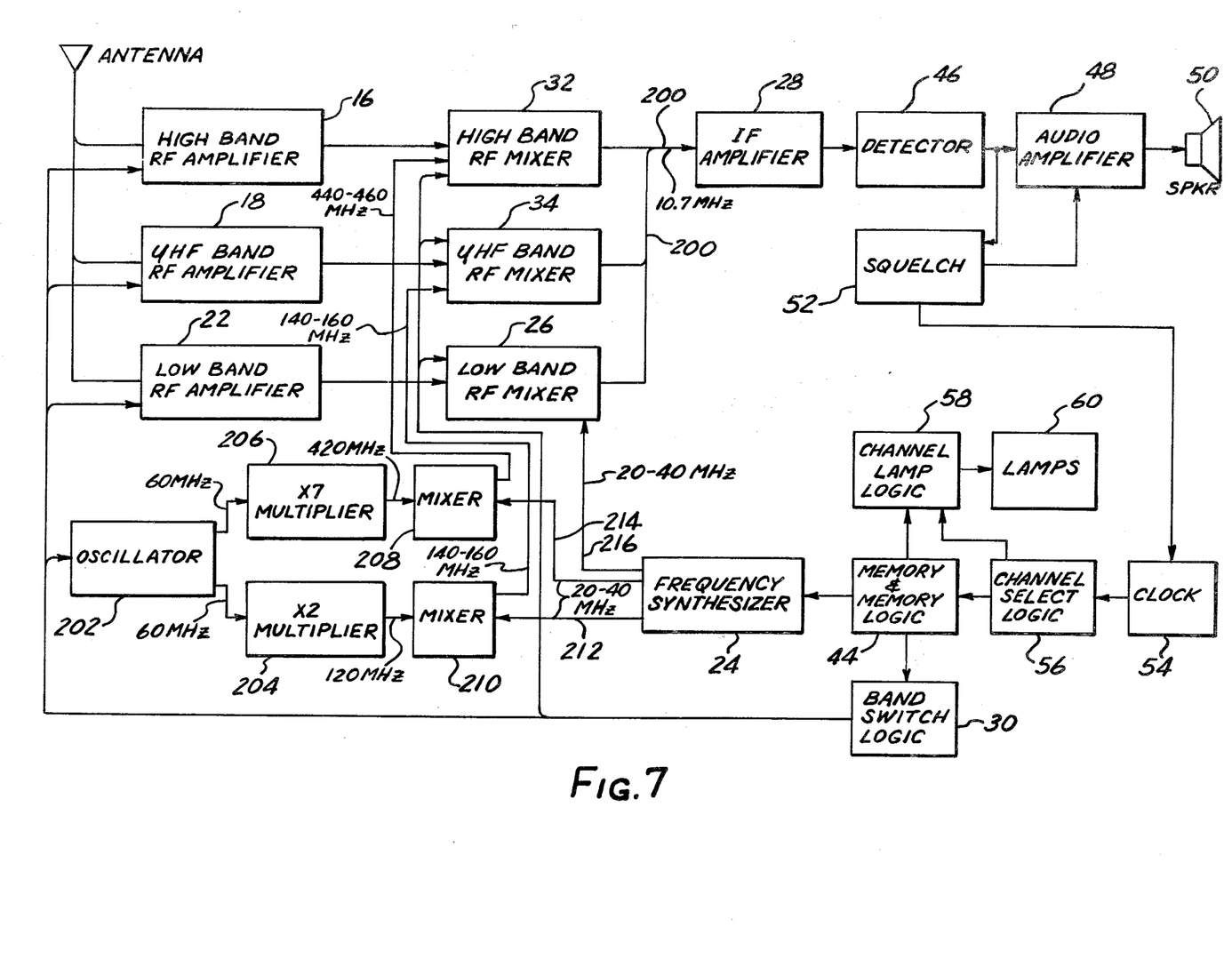
FIG. 7 is yet another modification of the circuitry shown in FIG. 1.

Yet another modification of the apparatus of the present invention is shown in FIG. 7 and represents a block diagram of a scanning receiver that is similar to that shown in FIG. 1. Where the circuits represented by the blocks in FIG. 7 are substantially similar to those shown and described with respect to the block diagram of FIG. 1, the same description and designator numbers have been used. As previously described, the receiver shown in FIG. 1 translates the higher band frequencies down to the frequency of the low band RF amplifier and uses the frequency synthesizer 24 to provide a beating signal input to the low band mixer 26 and the resulting 10.7 MHz output signal is fed to IF amplifer 28. By transposing the higher frequencies down to the low band frequency, the output of the frequency synthesizer can be used to tune channels that are within any of the three bands, i.e., the high band, UHF band, and low band as shown. However, rather than transposing the UHF and high band frequencies down to the low band as shown in FIG. 1, the modification shown in FIG. 7 has the output of each of the RF band mixers directly connected to the IF amplifier by line 200. Thus, the frequency of the output signal from each of the RF band mixers is at the IF input frequency of 10.7 MHz. The modification also includes a logic oscillator 202 having a 60 MHz output frequency which is applied to a frequency doubler 204 as well as to a multiplier 206 which multiplies the input frequency by the factor of 7. The multiplier 206 has an output frequency of 420 MHz which is applied to an intermediate mixer 208 and the frequency doubler 204 has an output frequency of 120 MHz which is applied to a mixer 210. The mixers 208 and 210 have inputs supplied by the frequency synthesizer 24 through lines 212 and 214 in addition to the constant frequency inputs from the multipliers. The output frequency of the frequency synthesizer is within the range of about 20–40 MHz as was the case for the frequency synthesizer in the block diagram of FIG. 1 so the output of the intermediate mixer 208 will vary from about 440 to about 460 MHz depending upon the frequency of the signal from the frequency synthesizer. The output of the intermediate mixer 208 is applied to the high band mixer 32 to produce the 10.7 MHz output on line 200. Similarly, the output of mixer 210 varies within the range of about 140 to 160 MHz depending upon the frequency of the output of the frequency synthesizer and the output of the mixer 210 is applied to the UHF band mixer 34 and its output is also 10.7 MHz. The output of the frequency synthesizer 24 is also applied to the low band mixer 26 through line 216. From the foregoing, it is seen that the output of the frequency synthesizer 24 varies within the range of 20 to about 40 MHz as was the case for the arrangement shown in FIG. 1, but the output is fed to intermediate mixers for the upper frequency bands prior to being applied to the RF band mixers. The band switching logic 30 also is interconnected with the local oscillator 202 as well as the RF amplifiers and mixers of each of the bands so that selective energization occurs depending upon the particular band in which a tuned channel is located. More specifically, if a channel lies within the low band, the oscillator 202 will not be energized, nor will the RF amplifiers and mixers of the UHF and high bands. However, if the channel to be received lies within the high or UHF bands, then the oscillator 202 is energized as is the RF amplifier and mixer of the particular band in which the channel is located.

The arrangement shown in FIG. 7 has advantages if undesirable noise becomes problematic. The arrangement shown in FIG. 7 is effective in substantially reducing the spurious mixer products that may be present in other arrangements such as shown in FIG. 1. When the frequency is converted downwardly, each mixer has a spurious mixer response that is a function of the power of the number of conversions. Thus, the arrangement shown in FIG. 7 may substantially reduce the amount of noise that can be generated due to spurious mixer products caused by translating the upper frequency bands down to the lower band frequency before mixing the frequency synthesizer output to provide the IF amplifier input signal.

The scanning receiver embodying the present invention will now be described in greater detail in conjunction with the more detailed circuit schematic diagrams shown in FIGS. 3 and 4. Many of the specific circuits previously described with respect to the block diagram of FIG. 1 are well known and of conventional design, and for that reason a detailed explanation of these circuits is not included herein. Thus, a detailed description of the circuit components and the operation of the RF amplifiers, the frequency triplers, the mixers and oscillators and the like will not be included. Moreover, the circuitry shown in FIGS. 3 and 4 also includes several integrated circuits that are illustrated in block form output of the random access memory to parallel form for the divider 80.

Broadly stated, when a particular one of the 16 columns in the 16 by 16 matrix of the RAM 118 is addressed by a four bit binary code appearing on the lines 120 from the counter 56, the other binary counter 124 rapidly sequences through the 16 rows that are programmed into the column that was addressed, thereby producing a 16 bit serial output on lines 128 which are connected to the shift register 126. It should be understood that the binary counter 124 (addressing the rows rather than the columns) is clocked at a much faster rate than the binary counter 56 which addresses the columns. Accordingly, once a column is addressed, the binary counter 124 rapidly sequences through the 16 rows and produces the output that is fed to the shift register.

More specifically, the channel scan rate is determined by the clock 54 (see the lower left portion of FIG. 3) which comprises a unijunction transistor 130 that is fired at a rate primarily determined by a capacitor 132 in combination with other circuit elements. Accordingly, the +5 v source voltage charges the capacitor 132 to a level sufficient to fire the transistor 130 and provide a positive pulse on line 134 which is applied to the input of the 4-bit binary counter 56. The pulse appearing on line 134 is also applied to the reset input of the binary counter 124 as will be more fully described hereinafter.

The clock 54 may also be provided with a switch 136 to alternate the mode of operation between manual and automatic scanning. Placing the switch in the manual position prevents the capacitor 132 from charging to a level sufficient to fire the transistor 130 and, accordingly, the binary counter 56 will not operate until a momentary contact switch 138 is depressed, which applies a voltage sufficient to fire the transistor 130 and provide a signal pulse to the binary counter 56. Placing the switch 136 in the automatic scanning position as shown, permits the clock 54 to be free running to provide output pulses at a predetermined scan rate.

Once a channel is received, as detected by the detector 46, the squelch circuit 52 will provide a low voltage or approximate ground signal on line C which has the same effect as placing the switch 136 in manual position, i.e., it will prevent the transistor 130 from firing with the desirable effect that a channel will not be cut off or transferred while it is being received. However, in the event it is desired to switch to a different channel, even when a channel is being received, it is possible to depress the manual scan pushbutton (even when the switch 136 is in automatic position) and cause the receiver to search for another channel. Every pulse produced by the clock 54 is applied to the 4-bit binary counter 56 which sequentially produces the numbers 1–16 in binary form in the four lines 120. Thus, the sequentially produced numbers 1–16 on line 120 are applied to sequentially address the columns 1–16 in the RAM 118. The outputs are also applied through lines 120 to the integrated circuit binary-to-decimal decoders 114 and 116 which drive the indicating LEDs 110 that instantaneously identify the channels that are being scanned. In other words, the channel lamp logic circuit 58 which primarily comprises the decoders 114 and 116 merely convert the binary code to decimal information and illuminate the proper LED. For example, if channel number 9 was being scanned, the number 9 would appear in the 4-bit binary counter 56 which would be converted to decimal by the channel lamp logic circuit 58 and line 9' that is connected to the cathode of the appropriate LED, and a ground path would be provided through line 9' and the decoder 114, which would illuminate the number 9 LED, since the anodes of all of the LEDs 110 are connected to a positive voltage supply. In this manner, the LEDs are individually illuminated whenever its corresponding channel is being scanned.

The lockout switches 112 are provided to increase the scan rate by quickly removing those channels which are not programmed to a working frequency or if the listener does not wish to receive those channels at that time. Thus, any of the channels can be effectively removed by moving its respective lockout switch to the left. When a switch is in the left position and the binary counter reaches that number, a ground pulse is applied to line 140 which is connected to a transistor 142 placing it into conduction and allowing the voltage supply connected to its emitter to be applied to the emitter of the unijunction 130. This fires the unijunction transistor at a much faster rate than occurs when the capacitor 132 is charged in the normal manner. Thus, the scan rate is effectively increased compared to what it would be if all of the lockout switches 112 are in the positions shown.

The foregoing describes how the channels are sequentially scanned, in terms of illuminating the LEDs 110 and addressing the columns within the programmable RAM 118. However, each time a memory column is addressed, it is necessary to sequentially address each of the rows within that column to sequentially provide the data bits at the output for serial application to the shift register 126 for presentation in parallel to the inputs to the programmable divider 80 of the synthesizer 24. This sequential addressing is accomplished by the 4-bit binary counter 124 that is driven by another unijunction transistor 150 in conjunction with a transistor 152 and three diodes 154. The diodes 154 have their cathodes connected to three of the four output pins of the binary counter and their anodes connected to a positive potential as well as to the base of transistor 152 through a resistor. Considering the three diodes 154 and the transistor 152, it should be understood that transistor 152 will be in a normally conductive condition when the diodes 154 are not forward biased. Moreover, one or more of the diodes 154 will always be forward biased except when the binary number 16 is produced. Transistor 155 is provided to clear the counter if the counter happens to stop on the binary number 15 due to some irregular occurrence or during startup or the like. Unijunction transistor 150 is the principal component of a second gated clock circuit which has a rate preferably between 10 and 20 times faster than the channel scan rate of the clock 54, its firing rate being a function of a capacitor 156 in combination with the adjacent resistors. However, capacitor 156 will charge to a level sufficient to fire transistor 150 only when the transistor 152 is not conducting. Thus, when transistor 152 is conducting, transistor 150 will be prevented from firing and, conversely, when transistor 152 is non-conducting, the clock circuit will produce a burst of pulses that are between 10 and 20 times the rate of the clock circuit 54, with the pulses driving the binary counter 124 to sequentially address each of the rows within the RAM 118.

However, once the binary counter 124 reaches the number or state 16, none of the outputs to which the cathodes of the three diodes 154 are connected will be at a low potential and these diodes will be blocking which will turn on transistor 152 and gate the transistor 150 off. Thus, once the binary counter 124 has sequenced through the numbers and reaches number 16, the unijunction transistor 150 is gated off until it is reset. As previously mentioned, the pulses generated by the channel scanning clock 54 appear on lines 134 and are applied to the reset pin of the binary counter 124 which resets it to the zero state. This causes transistor 150 to operate and clock the counter 124 up until it reaches the number or state 16 again.

Each time the binary output of the binary counter 124 reaches a new number, it addresses a new row in the RAM 118 and the information stored at that location appears on pin 13 thereof, with the compliment of that information appearing on pin 14. The information is sequentially stored in the shift register which is clocked after a short delay each time the transistor 150 clocks the binary counter 124. Since the rate of the firing of unijunction transistor 150 is between 10 and 20 times faster than the rate of firing of the unijunction transistor 130 within the clock 54, the information from the RAM 118 is available to the shift register 126 and therefore to the synthesizer after the first 10% of the channel dwell time and for the remaining 90% of the dwell time as well.

During normal operation, a READ/WRITE line 160 (memory pin 15) is held at approximately ground potential by a NORMAL/PROGRAM switch 162 which is a double-pole, double-throw switch which maintains the memory in a RAM condition. It should also be noted that the NORMAL/PROGRAM switch 162, when placed in its normal position, applies a positive potential through a line 164 to the decoders 114 and 116, as well as to the emitters of transistors 166 located in the circuits of each of the LED 110 channel indicators. Thus, during normal operation, the emitters of the transistors 166 are at a high potential which maintains them in a non-conducting state and they have little effect on the conduction or non-conduction of the LEDs 110 during scanning.

To program the randon access memory 118 for the channels that are desired to be monitored by the receiver, the user will preferably be provided with a booklet or the like listing the binary codes and the frequency of the channel to which a particular code will receive. In other words, for every 5 kHz interval within any bandwidth, whether it be in the low, high or UHF band, a code will be available to program the memory so that it will provide the proper input data to the divider 80 of the synthesizer 24 as well as properly identify the correct band.

In accordance with an important aspect of the present invention, the receiver may be easily programmed by merely depressing the logical "0" or logical "1" momentary contact pushbuttons 170 and 172 in the proper order as indicated by the code book or the like when the double-pole switch 162 is placed in the PROGRAM position. The light emitting diodes 110 are also incorporated into the programming circuitry to function as a visual check to insure that the code is properly programmed or inserted in the random access memory 118. Thus, as the logical "0" and logical "1" pushbuttons are operated in accordance with the predetermined code for a particular channel that is to be monitored, the 16 LEDs will be selectively illuminated in a sequence identical to the code itself. For example, if the third bit or digit of the code is a logical "1", then the third LED of the completed code would also be illuminated as would any other logical "1" and any logical "0" would not be illuminated. In this manner, the user or "programmer" can check the code being programmed into the memory by visually comparing the code with the LEDs during and after completion of the entry of the code.

More specifically, when it is desired to program the RAM 118, the switch 162 is placed in the PROGRAM position which removes the positive potential from line 164 and therefore removes power from the decoders 114 and 116, while simultaneously grounding line 164 which effectively grounds the emitters of the transistors 166 that are located in the LED circuits. Grounding of the emitters of these transistors enables the shift register 126 to drive the indicator lamps since the bases of the transistors are connected to the outputs of the various flip-flops through respective resistors as shown. Thus, if a particular flip-flop has a positive or logical "1" output, it will place the transistor having its base attached thereto into conduction and provide a ground path for the LED that is connected to the collector of that transistor.

With the switch 162 in the PROGRAM position, positive potential is applied to the base of transistor 152 through a line 174 which places transistor 152 into conduction and disables the free running of unijunction transistor 150. Moreover, the switch 162 also applies a positive potential to the PROGRAM momentary contact pushbuttons 170 and 172 and the ground is removed from line 160 extending to the READ/WRITE pin of the memory. This allows the READ/WRITE line to be pulsed to WRITE by a transistor 176 through diode 178. Thus, the memory may be programmed by pushing the logical "1" and "0" buttons in the proper sequence for the frequency that is desired. It is initially necessary to press the "0" button twice in order to increment the binary counter 124 from its state or number 14 to the state zero. Thereafter, twelve logical "1" or "0" bits are entered, followed by two bits which identify the proper band for the channel.

As the "0" or "1" buttons are depressed, unijunction transistor 150 is clocked one pulse at a time by connecting the positive potential through switch 162 through either of the momentary switches and a capacitor 180. When the "0" button 170 is depressed, unijunction transistor 150 is clocked and the data input line 182 which is connected to pin 12 of the memory is held in a low position by a resistor 186 so that a "0" is entered into the memory. Similarly, when the logical "1" button 172 is depressed, the unijunction transistor 150 is clocked and the data input line is driven to a high potential since it is not blocked by diode 184 and a logical "1" is entered into the memory. The data entered appears on RAM output lines 128, so that the shift register is loaded simultaneously as the memory and the LEDs 110 are also energized in the identical sequence as the "0" and "1" bits are entered into the memory.

After the code is completely programmed into the memory, subsequent codes for other channels may similarly be programmed by merely placing the switch 136 of the clock 54 in the MANUAL position, returning the double-throw switch 162 to its NORMAL position, depressing the switch 138 of the clock 54 to address another column within the RAM 118, thereafter switching the double-throw switch 162 to the PROGRAM position and entering the code sequence as previously described. By repeating these steps, it is possible to enter 16 different channel frequencies in the three various bands. A battery 190 is provided for the RAM 118 so that the codes that are programmed into the memory will not be lost when external power is lost or removed from the receiver.

From the foregoing detailed description, it should be understood that an improved scanning FM monitor receiver which has many advantages over prior art scanning receivers has been shown and described. More specifically, the receiver of the present invention eliminates the necessity of incorporating crystals for each channel by using a frequency synthesizer together with random access memory and memory logic circuitry which stores codes that are used to generate up to 16 different channel frequencies. The user may easily program the memory and thereby select the channel frequencies that the user desires to monitor. Subsequently of the original programming, it is possible to reprogram the memory if desired, to change channels that are to be monitored. Moreover, priority channels can be set up in the sense that lockout switches can eliminate all but a select few of the channels and thereby cause the receiver to monitor only those few channels. Moreover, this is achieved without affecting the codes previously programmed into the memory. Indicator lights are provided to give a visual indication of a particular channel when it is being scanned or received, together with the band in which the channel is located. The lights also perform the dual function of providing a visual check of the accuracy of the code as it is being programmed into the memory, to insure that the desired frequency will be generated by the frequency synthesizer.

It is of course understood that although various preferred embodiments of the present invention have been illustrated and described, various modifications thereof will become apparent to those skilled in the art, and accordingly, the scope of the present invention should be defined only by the appended claims and equivalents thereof.

Various features of the invention are set forth in the following claims.

What is claimed is:

1. A signal seeking receiver for automatically scanning and monitoring a plurality of channels of predetermined radio frequencies lying in a low RF band and in a plurality of separate and spaced apart higher RF bands, and for tuning a received channel signal having a frequency corresponding to one of said channels, said receiver comprising:

a separate RF section uniquely associated with each of said RF bands and including a RF amplifier and a RF band mixer, each of said RF band mixers having an output;

band switch logic means for producing a band logic signal indicating that a channel being scanned is within a particular one of said RF bands for energizing only one of said RF sections corresponding to said band logic signal;

phase-locked-loop frequency synthesizing means responsive to a predetermined combination of input signals applied thereto for generating a synthesized frequency beating signal at an output of said frequency synthesizing means;

programmable memory means connected to said frequency synthesizing means for storing various preselected combinations of said input signals at predetermined addresses;

means for programming said memory means to enter said various preselected combinations of input signals at predetermined addresses in said memory means, said programming means including means for manually and separately producing each of said various combinations of signals;

means connected to said memory means for selectively addressing said memory means to thereby cause a selected combination of input signals to be applied to said frequency synthesizing means;

a first supplemental mixer connected between the output of said frequency synthesizing means and a first one of said RF band mixers;

a second supplemental mixer connected between the output of said frequency synthesizing means and a second one of said RF band mixers, a third one of said RF band mixers directly connected to the output of said frequency synthesizing means for receiving said synthesized frequency beating signal;

oscillator means responsive to said band logic signal for providing a substantially constant oscillator frequency signal to at least one of said supplemental mixers when said band signal indicates that the channel being scanned is within one of said RF bands corresponding to said first or said second supplemental mixer;

first frequency multiplier means connected between said oscillator means and said first supplemental mixer for multiplying said oscillator signal by a first factor;

second frequency multiplier means connected between said oscillator means and said second supplemental mixer for multiplying said oscillator signal by a factor different from said first factor;

means responsive to said band logic signal for energizing only one of said RF sections to tune a received channel signal and provide an intermediate signal at the output of the RF band mixer of said energized RF section;

an IF section directly connected in common to the output of each of said RF band mixers, and including an IF amplifier for amplifying said intermediate signal;

detector means coupled to said IF amplifier for producing an audio signal in response to said intermediate signal;

an audio amplifier connected to said detector means for driving an audio speaker with said audio signal; and means for producing an inhibiting signal and for disabling said audio amplifier when a channel signal is not being received.

2. A receiver as defined in claim 1 further including means for activating said addressing means for sequencing among said preselected combinations of input signals to scan said channels, said activating means being disabled in response to receiving said inhibiting signal, and being subsequently reactivated for resuming scanning of said channels in response to the termination of said inhibiting signal indicating said channel is no longer being received.

3. A receiver as defined in claim 1 wherein said RF section including said third RF band mixer directly connected to the output of said frequency synthesizing means is uniquely associated with said low RF band.

* * * * *